(12) United States Patent
Godshalk et al.

(10) Patent No.: US 8,952,768 B2
(45) Date of Patent: Feb. 10, 2015

(54) OPTIMAL ACOUSTIC IMPEDANCE MATERIALS FOR POLISHED SUBSTRATE COATING TO SUPPRESS PASSBAND RIPPLE IN BAW RESONATORS AND FILTERS

(71) Applicant: TriQuint Semiconductor, Inc., Hillsboro, OR (US)

(72) Inventors: Edward Martin Godshalk, Newberg, OR (US); Rick D. Lutz, Fort Collins, CO (US); Masud Hannan, Portland, OR (US); Ralph N. Wall, Beaverton, OR (US); Uppili Sridhar, Morgan Hill, CA (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 7 days.

(21) Appl. No.: 13/971,721

(22) Filed: Aug. 20, 2013

(65) Prior Publication Data

US 2013/0335169 A1 Dec. 19, 2013

Related U.S. Application Data

(63) Continuation of application No. 11/950,149, filed on Dec. 4, 2007, now Pat. No. 8,512,800.

(51) Int. Cl.
*H03H 9/00* (2006.01)
*H03H 9/02* (2006.01)
(Continued)

(52) U.S. Cl.
CPC .............. *H03H 9/15* (2013.01); *H03H 9/0211* (2013.01); *H03H 9/02055* (2013.01); *H03H 9/175* (2013.01)
USPC ............ 333/187; 333/189; 333/191; 427/100

(58) Field of Classification Search
USPC .......................................... 333/187; 427/100
See application file for complete search history.

(56) References Cited

U.S. PATENT DOCUMENTS 5,325,012 A 6/1994 Sato et al.
5,373,268 A 12/1994 Dworsky et al.
(Continued)

FOREIGN PATENT DOCUMENTS

EP 060955 8/1994
EP 0609555 8/1994
(Continued)

OTHER PUBLICATIONS

Lakin, K.M. and Lakin K.G., Numerical Analysis of Thin Film BAW Resonators, IEEE 2003 Ultrasonics Symposium, Oct. 5-8, Paper 4A-3, TFR Technologies, Inc. Sep. 27, 2003.
(Continued)

*Primary Examiner* — Michael Cleveland
*Assistant Examiner* — Austin Murata
(74) *Attorney, Agent, or Firm* — Blakely Sokoloff Taylor & Zafman LLP

(57) ABSTRACT

A bulk acoustic wave (BAW) resonator is constructed to reduce phase and amplitude ripples in a frequency response. The BAW resonator is fabricated on a substrate 400 μm thick or less, preferably approximately 325 μm, having a first side and a polished second side with a peak-to-peak roughness of approximately 1000 A. A Bragg mirror having alternate layers of a high acoustic impedance material, such as tungsten, and a low acoustic impedance material is fabricated on the first side of the substrate. A BAW resonator is fabricated on the Bragg mirror. A lossy material, such as epoxy, coats the second side of the substrate opposite the first side. The lossy material has an acoustic impedance in the range of 0.01× to 1.0× the acoustic impedance of the layers of high acoustic impedance material.

6 Claims, 10 Drawing Sheets

(51) Int. Cl.
*H03H 9/15* (2006.01)
*H03H 9/17* (2006.01)

(56) References Cited

U.S. PATENT DOCUMENTS

| | | | |
|---|---|---|---|
| 6,060,818 | A | 5/2000 | Ruby et al. |
| 6,239,536 | B1 | 5/2001 | Lakin |
| 6,291,931 | B1 | 9/2001 | Lakin |
| 6,480,074 | B1 | 11/2002 | Kaitila et al. |
| 6,577,043 | B2 | 6/2003 | Tsukai et al. |
| 6,878,604 | B2 | 4/2005 | Aigner et al. |
| 6,943,647 | B2 | 9/2005 | Aigner et al. |
| 7,002,437 | B2 | 2/2006 | Takeuchi et al. |
| 7,221,242 | B2 | 5/2007 | Asai et al. |
| 7,463,117 | B2 | 12/2008 | Ohara et al. |
| 7,466,213 | B2 | 12/2008 | Loble et al. |
| 7,554,426 | B2 | 6/2009 | Lee et al. |
| 7,612,488 | B1 | 11/2009 | Bouche et al. |
| 2001/0008205 | A1 | 7/2001 | Wilke et al. |
| 2002/0030420 | A1 | 3/2002 | Tsukai et al. |
| 2002/0084873 | A1 | 7/2002 | Ella et al. |
| 2003/0087177 | A1 | 5/2003 | Miyamoto et al. |
| 2003/0199105 | A1 | 10/2003 | Kub et al. |
| 2004/0140869 | A1* | 7/2004 | Marksteiner et al. ......... 333/189 |
| 2004/0146264 | A1 | 7/2004 | Auner et al. |
| 2004/0212277 | A1 | 10/2004 | Stommer |
| 2004/0227591 | A1 | 11/2004 | Aigner et al. |
| 2005/0073027 | A1 | 4/2005 | Irikura et al. |
| 2005/0093157 | A1 | 5/2005 | Noguchi et al. |
| 2006/0043507 | A1* | 3/2006 | Lobl et al. ...................... 257/416 |
| 2006/0202779 | A1 | 9/2006 | Fazzio et al. |
| 2008/0042780 | A1 | 2/2008 | Lee et al. |
| 2008/0150653 | A1 | 6/2008 | Hara et al. |
| 2009/0224851 | A1* | 9/2009 | Feiertag et al. ............... 333/186 |

FOREIGN PATENT DOCUMENTS

| | | |
|---|---|---|
| EP | 0771070 | 5/1997 |
| EP | 1418671 | 5/2004 |
| EP | 1748556 | 1/2007 |
| WO | 03/006701 | 1/2003 |
| WO | 2006004470 | 1/2006 |
| WO | 2006101450 | 9/2006 |

OTHER PUBLICATIONS

Loebl et al., "low-level effects in sbars and their application to device optimisation" IEEE Ultrasonics Symposium 2003 (pp. 182-186.
International Search Report and Written Opinion of the International Searching Authority Dated Nov. 14, 2008, International Application No. PCT/U52008/008527.
International Search Report and Written Opinion of the International Searching Authority Dated Nov. 7, 2008, International Application No. PCT/US2008/007282.
International Search Report and Written Opinion of the International Searching Authority Dated Sep. 8, 2008, International Application No. PCT/US2008/005628.
Auner, G.W., et al., "Microstructure of low temperature grown AiN thin films on Si (111)", Journal of Applied Physics, vol. 85, No. 11, (Jun. 1, 1999), pp. 7879-7883.
Fattinger, G.G., et al., "Optimization of Acoustic Dispersion for High Performance Thin Film BAW Resonators", IEEE Ultrasonics Symposium, (2005), pp. 1175-1178.
Kaitila, J., et al., "Spurious Resonance Free Bulk Acoustic Wave Resonators", IEEE Ultrasonics Symposium, (2003), pp. 84-87.
Loebl, H.P., et al. "RF Bulk Acoustic Wave Resonators and Filters", Journal Electroceramics, No. 12, (2004), pp. 109-118.
Park, Jae Y., et al., Micromachined FBAR RF Filters for Advanced Handset Applications, 12 International Conference on Solid State Sensors, Actuators and Microsystems, (2003), pp. 911-914.
Pensala, Tuomas, et al., "Spurious resonance suppression in ZnO based thin-film BAW Resonators: FEM modeling and experiment", IEEE Ultrasonics Symposium, (2005), pp. 1844-1847.
Schmidhammer, Edgar, et al., "High Volume Production of a Fully Matched 5050 PCS-CDMA-BAW Duplexer", IEEE Ultrasonics Symposium, (2006), pp. 329-332.
Ueda, Masanori, et al., "High-Q Resonators Using FBAR/SAW Technology and Their Applications", IEEE, (2005), 4 pgs.
W.E. Newell, "Face-Mounted Piezoelectric Resonators", Proceedings of the IEEE, Jun. 1965, pp. 575-581, vol. 53.
K.M. Lakin et al., "Advancement of MEMS into RF-Filter Applications", Proceedings of the IEDM, Dec. 2002, pp. 897-900.
R. Aigner, et al., "Advancement of MEMS into RF-Filter Applications", Proceedings of the IEDM, Dec. 2002, pp. 897-900.
K.M. Lakin et al., "Stacked Crystal Filters Implemented with Thin Films", 43rd Annual Symposium on Frequency Control, 1989.

* cited by examiner

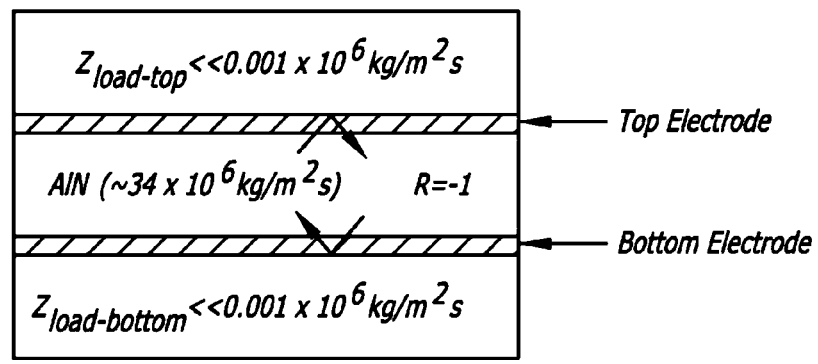
FIG. 11
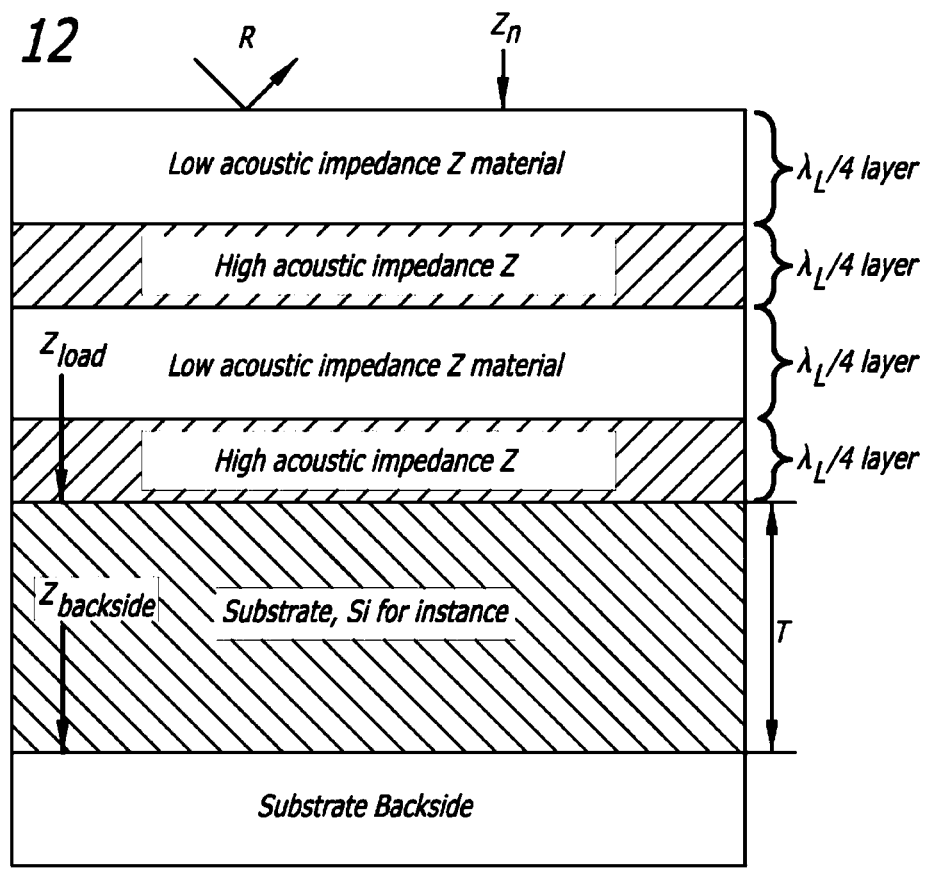

OPTIMAL ACOUSTIC IMPEDANCE MATERIALS FOR POLISHED SUBSTRATE COATING TO SUPPRESS PASSBAND RIPPLE IN BAW RESONATORS AND FILTERS

CROSS REFERENCE TO RELATED APPLICATIONS

This application is a continuation of application Ser. No. 11/950,149, filed Dec. 4, 2007, now U.S. Pat. No. 8,512,800, which is hereby incorporated by reference in its entirety.

BACKGROUND

1. Field

Embodiments of the invention relate to the field of piezoelectric resonators; and more specifically, to the suppression of passband ripple in bulk acoustic wave resonators.

2. Background

Piezoelectric resonators are primarily used for signal filtering and reference oscillators. These resonators are commonly referred to as FBAR (film bulk acoustic resonators) or BAW (bulk acoustic wave resonators).

The resonator consists of piezoelectric material (i.e., aluminum nitride, AlN) sandwiched between two electrodes as shown in FIG. 1. For good performance the resonator must be acoustically isolated from the mechanical substrate (typically a silicon wafer). This is accomplished by an air gap (FBAR) or a Bragg mirror for solidly mounted resonators (SMR) of alternating high and low acoustic impedance materials designed to be one-quarter wavelength thick ($\lambda_L/4$) at the operating frequency. These devices are not new and are well documented in the literature. (See "Face-mounted piezoelectric resonators", W. E. Newell, Proc. IEEE, Vol. 53, June 1965, Pgs. 575-581, U.S. Pat. No. 5,373,268, "Stacked Crystal Filters Implemented with Thin Films", K. M. Lakin et al., 43rd Ann. Freq. Contr. Symp., May 1989, Pgs. 536-543 and "Advancement of MEMS into RF-Filter Applications", R. Aigner et al., Proc. of IEDM 2002, San Francisco, Dec. 8-11, 2002, Pgs. 897-900.) The following is more specific to the SMR class of BAW devices.

Bragg mirrors have been developed in both microwave and optical applications to create a high reflection coefficient at a specified interface. In the case of the BAW resonator, the interface of interest is between the bottom electrode of the BAW resonator and the top of the Bragg mirror stack. An ideal Bragg mirror stack would create a unity reflection coefficient at this interface and perfectly isolate the BAW resonator from the substrate. In that case the substrate (typically silicon) would have no influence on the performance of the BAW resonator. This is not achievable in practice, since for an acceptable level of isolation (i.e., nominally 99% or better reflection coefficient) at the interface, several layers of high and low impedance materials (also called bi-layers) are required, which is generally not practical from a processing or cost standpoint. Typically only 2 to 3 bi-layers are practical, which allows some leakage of acoustic energy into the substrate that manifests itself as loss in the passband. Of interest to this invention is that when the substrate is an odd multiple of quarter wavelengths thick, it can present a boundary condition at the bottom of the Bragg mirror stack that will cause the required reflection condition to fail, causing ripples in the passband. These ripples are harmonically related to the substrate thickness T. Both of these phenomena are shown in FIG. 2. This condition can be prevented if a lossy material having an optimal acoustic impedance is applied to the substrate backside.

Referring to FIG. 2, the acoustic energy that leaks through the Bragg mirror causes two problems. The first is increased insertion loss due to energy leakage out of the BAW resonator, as illustrated by arrow 1. The second is reflections of acoustic energy off of the substrate backside, causing a boundary condition at the Bragg mirror backside that results in ripples in the BAW resonator passband, at frequencies where the substrate is an odd number of quarter wavelengths thick, as illustrated by arrow 2.

It has been proposed that BAW resonator performance can be improved by roughening the substrate backside, by either mechanical or chemical means (See "Face-mounted piezoelectric resonators", W. E. Newell, Proc. IEEE, Vol. 53, June 1965, Pgs. 575-581 and U.S. Pat. No. 5,373,268) and/or adding an epoxy (See "Face-mounted piezoelectric resonators", W. E. Newell, Proc. IEEE, Vol. 53, June 1965, Pgs. 575-581) or other material to that rough backside as shown in FIG. 3. The theory is that the acoustic energy that leaks through the Bragg stack will be either "partially scattered" by the rough surface or absorbed by the epoxy (or other absorptive material). This will in turn improve the passband performance by reducing the amplitude of acoustic energy reflected back into the bottom of the Bragg stack and hence reduce passband ripple.

FIG. 3 schematically illustrates a substrate with a rough backside and absorber on the backside. Acoustic energy that leaks through the Bragg mirror stack is scattered by the rough surface (1) and absorbed (2). The benefit is reduced ripple due to attenuation of reflected acoustic energy into the BAW resonator (3). The penalty is energy loss in the passband due to scattered and absorbed energy.

BRIEF DESCRIPTION OF THE DRAWINGS

The invention may best be understood by referring to the following description and accompanying drawings that are used to illustrate embodiments of the invention by way of example and not limitation. In the drawings, in which like reference numerals indicate similar elements:

FIG. 11 illustrates a generic BAW resonator structure with a piezoelectric layer bounded by two electrodes.

FIG. 12 illustrates a cross-section of a BAW resonator for a substrate with thickness T.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 4A:
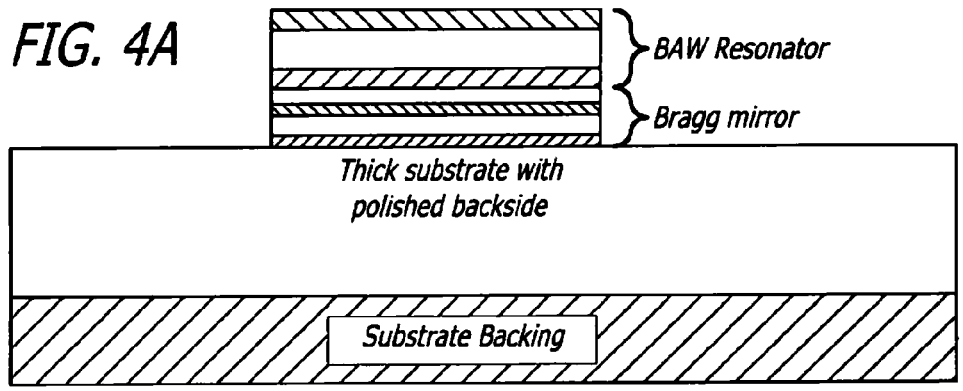
FIGS. 4A and 4B illustrate a typical BAW resonators and Bragg mirrors on a substrate.
Figure 4B:
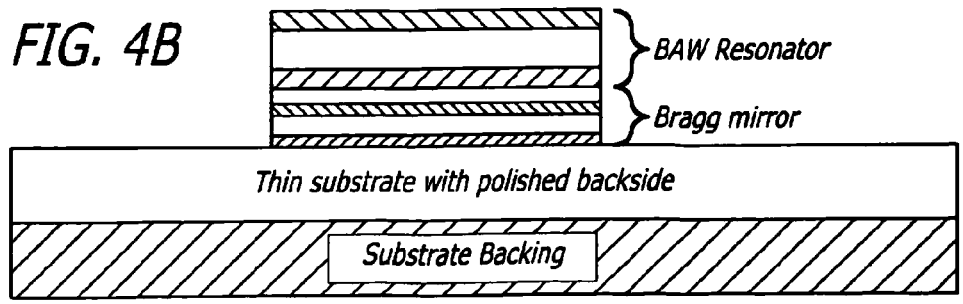

A typical BAW resonator and Bragg mirror on a substrate is shown in FIGS. 4A and 4B, specifically, in FIG. 4A on a nominally 725 μm thick substrate and in FIG. 4B on a nominally 325 μm thick substrate. The scattering parameter transmission coefficient ($S_{21}$) through a filter constructed using thick (FIG. 4A) and thin (FIG. 4B) substrates are shown in FIG. 5.

In FIGS. 4A and 4B, the BAW resonators on a thick (725 μm) and thin (325 μm) substrate have a polished backside. The filter on the 725 μm thick substrate shows in FIG. 5 a passband ripple occurring nominally every 6.1 MHz due to the primary longitudinal mode leaking out of the BAW resonator bottom electrode through the Bragg mirror and then into the substrate. At frequencies where the substrate thickness T is an odd multiple of longitudinal quarter wavelengths, a condition can exist at the bottom of the Bragg mirror causing ripples in the passband if the acoustic impedance of the substrate backing is not in a proper range of values. These ripples are caused by increased transmission of acoustic energy into the Bragg mirror when a high impedance condition exists at the top of the substrate, as subsequently explained in greater detail. It will be shown that for a 725 μm "thick" silicon substrate, the ripples are spaced at 6.1 MHz intervals, and for a 325 μm "thin" substrate they are spaced at 13.5 MHz. The advantage to using a thinned substrate is that there are fewer ripples in the passband.

Figure 5:
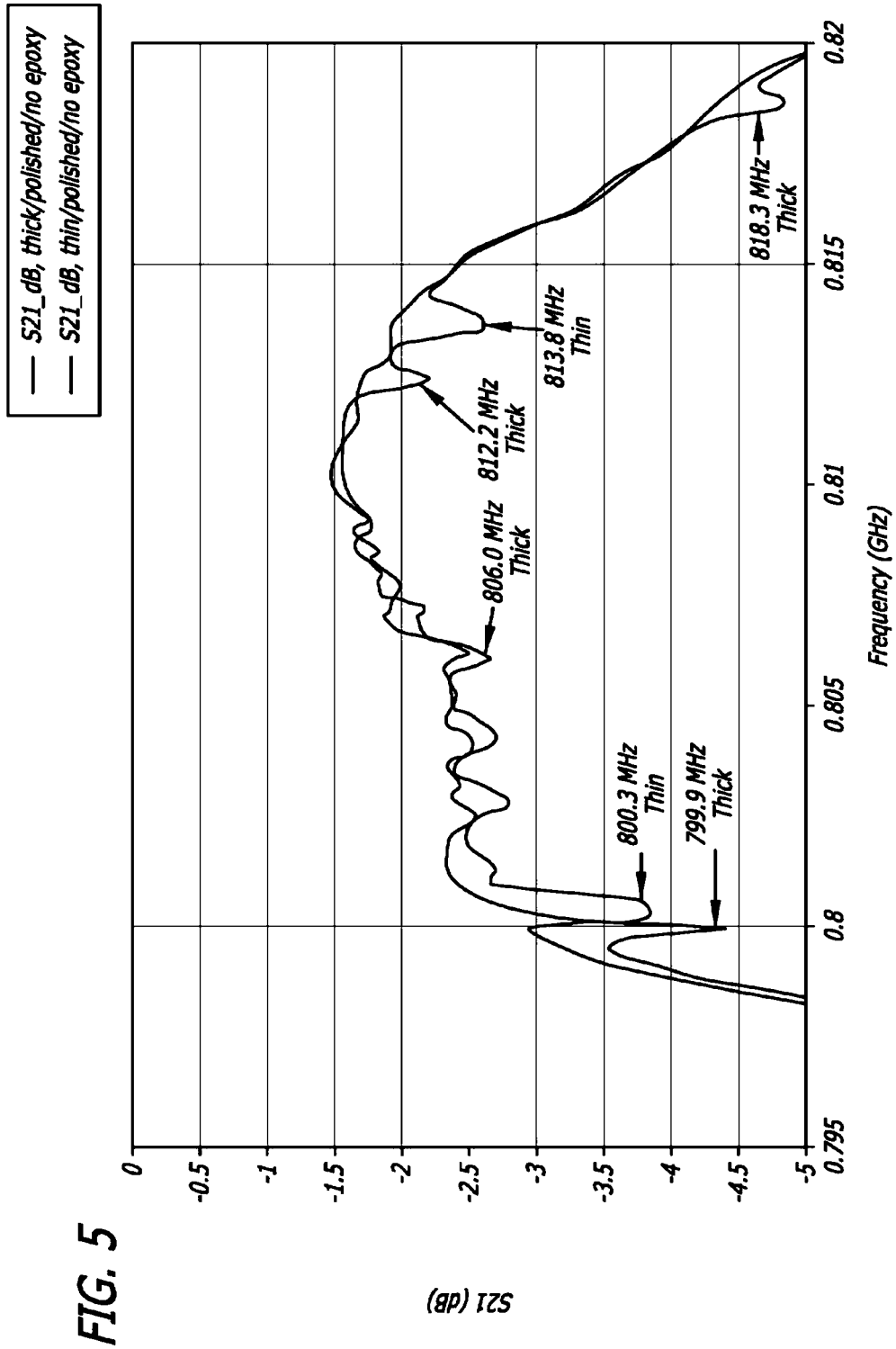
FIG. 5 shows S21 data for a filter using BAW resonators on a 725 µm versus 325 µm thick substrate.

This is shown FIG. 5, wherein the transmission coefficient $S_{21}$ data for a filter using BAW resonators on a 725 μm versus 325 μm thick substrate is presented. On the 725 μm thick substrate, leakage of the longitudinal mode into the substrate causes a passband ripple every 6.1 MHz. By thinning the substrate to 325 μm, the ripple spacing is increased to 13.5 MHz. The other ripples are due to spurious modes that are not strongly influenced by the substrate thickness.

Figure 6:
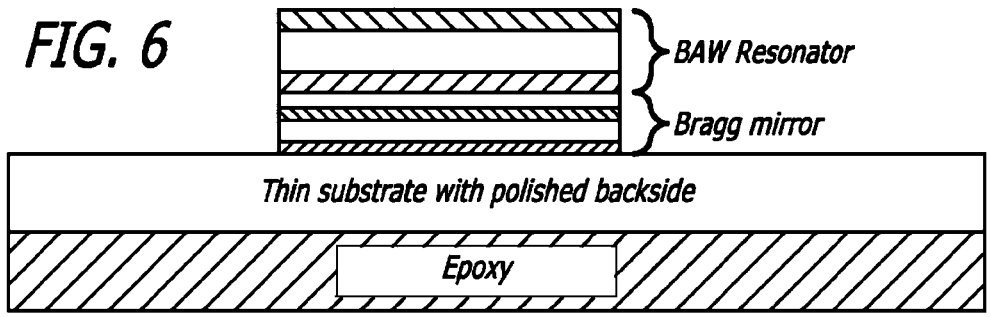
FIG. 6 illustrates a BAW resonator on a 325 µm thick substrate with a polished backside with epoxy.

To reduce passband ripple, the substrate backside can be coated with a lossy material preferably having an acoustic impedance in the range of 0.01× to 1.0× that of the acoustic impedance of the high impedance Bragg mirror layer. This prevents a condition that causes the Bragg mirror to not function correctly, as subsequently described. To accomplish this, the material, such as epoxy, is bonded to a polished substrate backside as shown in FIG. 6. The procedure is to first backgrind the wafer to the desired thickness and then fine polish (peak-to-peak roughness ~1000 A) the backside surface. By polishing the surface, a more uniform interface is created to provide a well defined boundary condition.

When Tungsten is the Bragg mirror high impedance layer (101×10$^6$ kg/m$^2$s), the material applied to the polished substrate backside preferably should have an acoustic impedance in the range of 1-100×10$^6$ kg/m$^2$s. In the following examples, an epoxy is used that has an acoustic impedance of approximately 2.4×10$^6$ kg/m$^2$s, which satisfies this condition.

Figure 7:
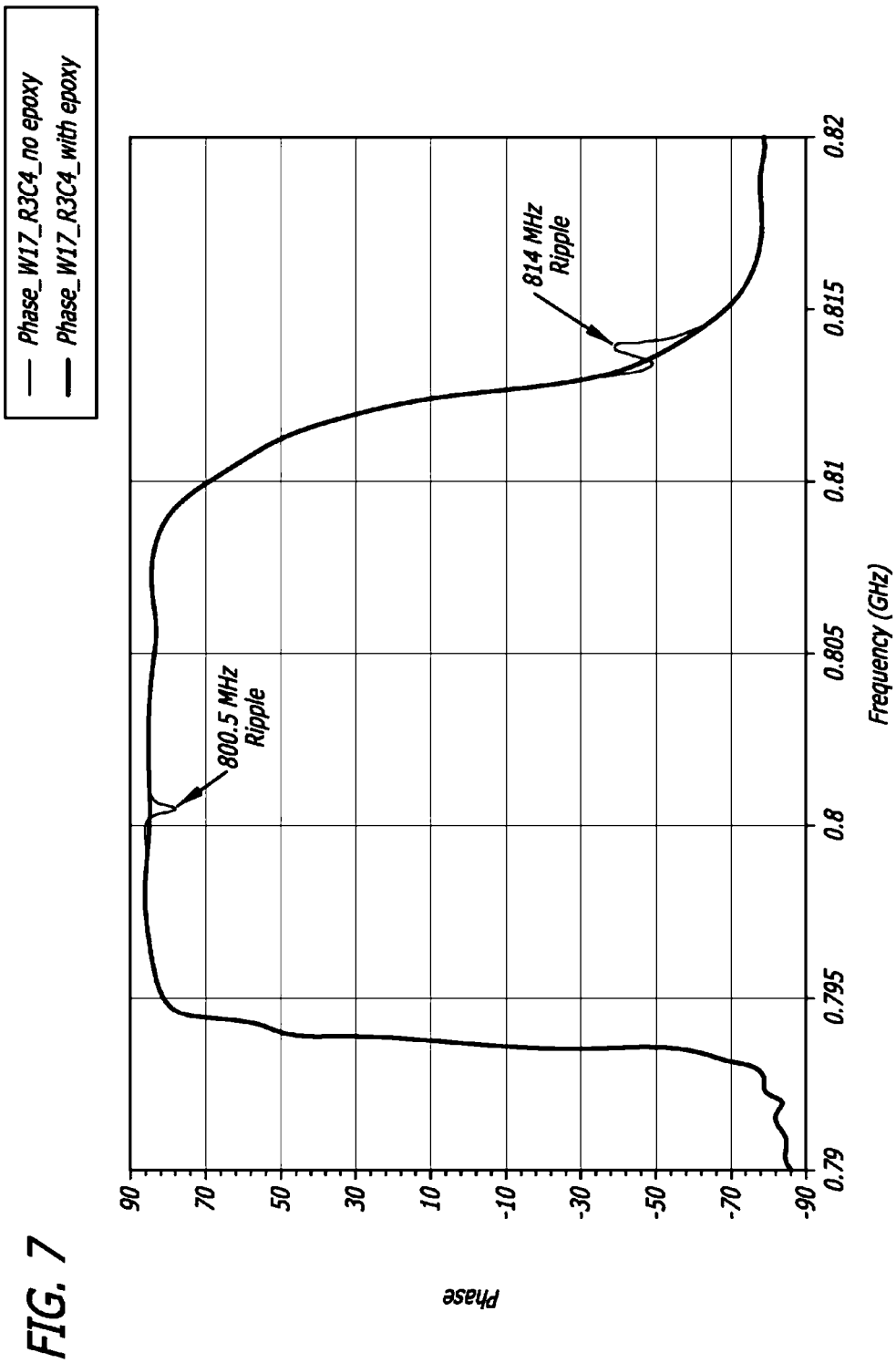
FIG. 7 shows the phase response for a BAW resonator on a 325 µm thick substrate with a polished backside, with and without epoxy.
Figure 8:
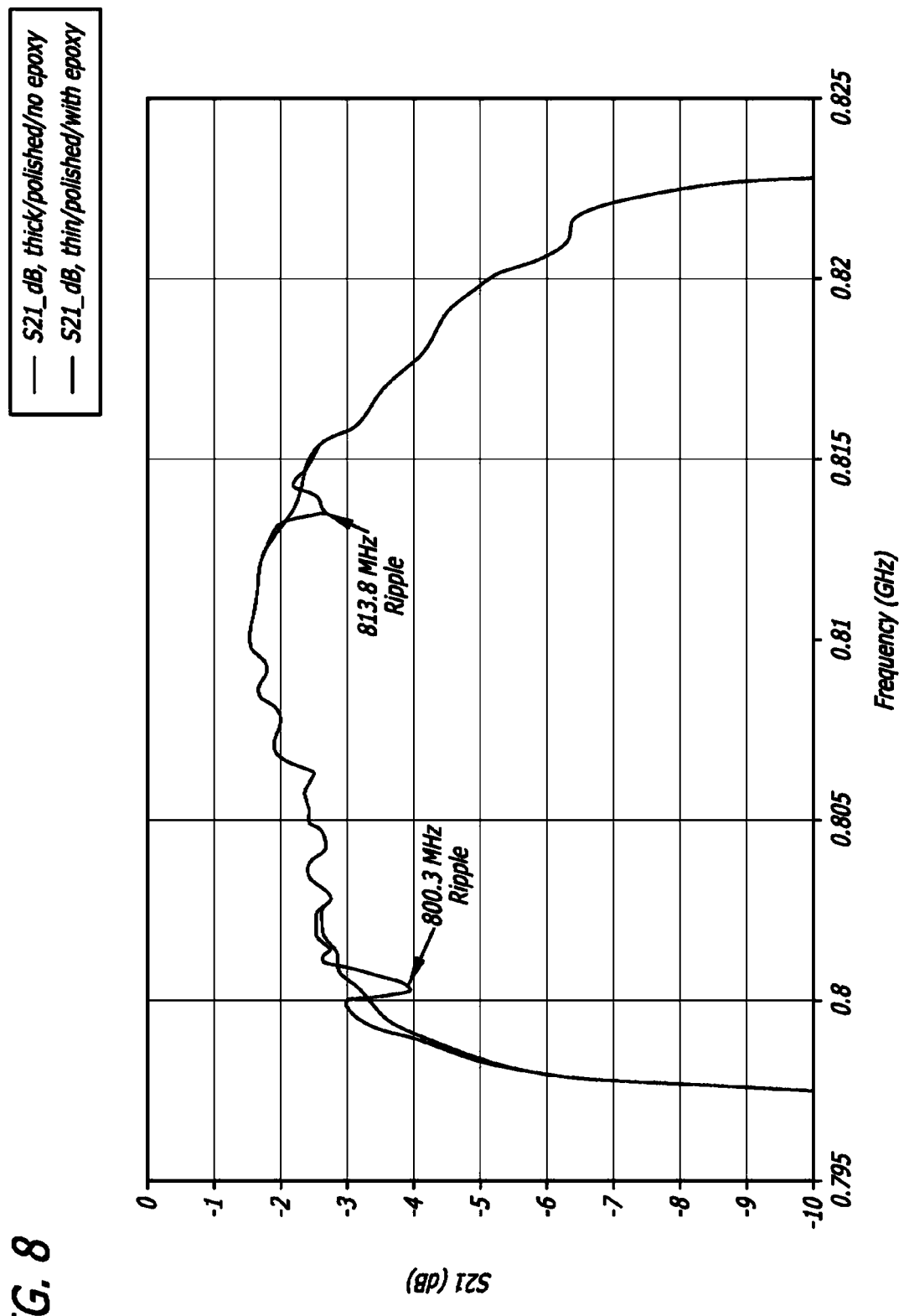
FIG. 8 shows the associated ripple in the transmission coefficient ($S_{21}$) for a filter constructed out of similar BAW resonators on a 325 µm thick substrate with a polished backside, with and without epoxy.

Reduction of passband ripple after epoxy is applied is shown in FIGS. 7 and 8 for a 325 μm thick silicon substrate. In FIG. 7, the phase of the input impedance of a single BAW resonator is shown for a BAW resonator on a 325 μm thick substrate with a polished backside, with and without epoxy. In the case without epoxy, the substrate is placed on a foam layer having an acoustic impedance on the order of that for air (430 kg/m$^2$s). The ripples are eliminated after epoxy is added. The phase is shown since it illustrates ripple better than the magnitude of the impedance for this type of device. The associated ripple in the transmission coefficient ($S_{21}$) for a filter constructed out of similar BAW resonators on a 325 μm thick substrate with a polished backside, with and without epoxy, is shown in FIG. 8. In the case without epoxy, the substrate is placed on a foam layer having an acoustic impedance on the order of air (430 kg/m$^2$s). The ripples are eliminated when the epoxy is added.

Figure 9:
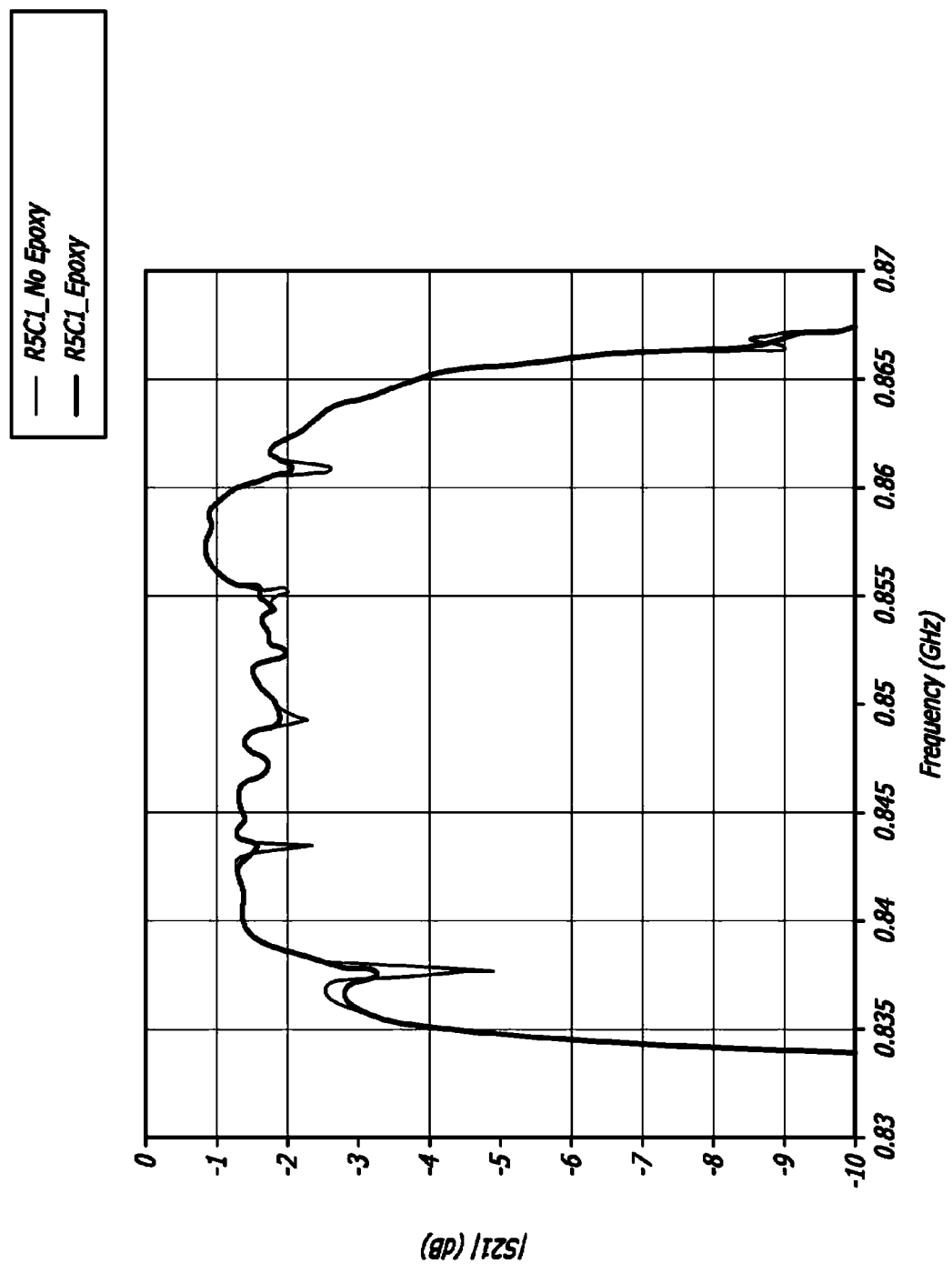
FIG. 9 shows the transmission coefficient ($S_{21}$) response for a filter using BAW resonators on a 725 µm thick substrate with a polished backside, with and without epoxy.

Thinning the wafer improves the effectiveness of the epoxy on suppression of passband ripple. This is illustrated by an example of suppressing ripple in the transmission coefficient $S_{21}$ for a BAW filter on a thick wafer (725 μm) as shown in FIG. 9. The epoxy reduces the ripple amplitude, but the reduction in ripple amplitude is not as pronounced as shown for the thinner substrate (325 μm) in FIG. 8. This is due to the thicker substrate allowing more dispersion of acoustic energy into the substrate that leaked through the Bragg mirror, which diminishes the available acoustic energy that can be reflected from the backside material having the optimal acoustic impedance. For this reason it is desirable to use thin wafers (i.e., ≤400 μm) to improve the effectiveness of the epoxy on suppression of passband ripple.

Figure 10A:
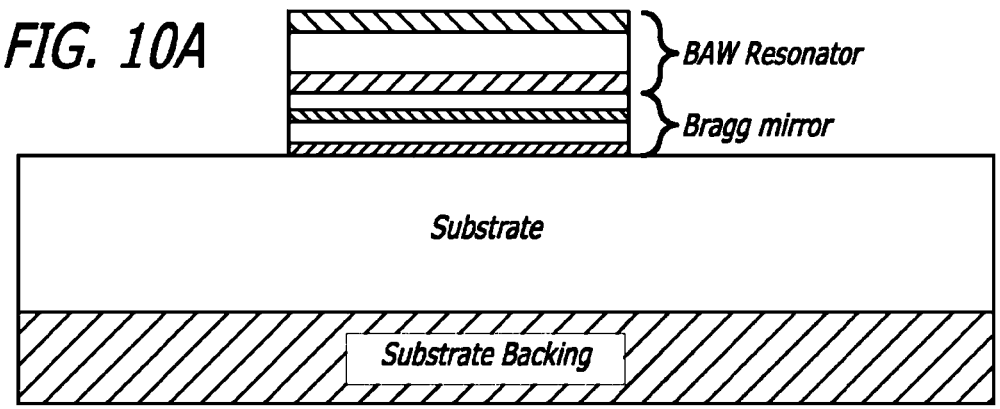
FIGS. 10A and 10B illustrates the generic structure of a BAW resonator on a Bragg mirror on a substrate without and with epoxy on the backside of the substrate.
Figure 10B:
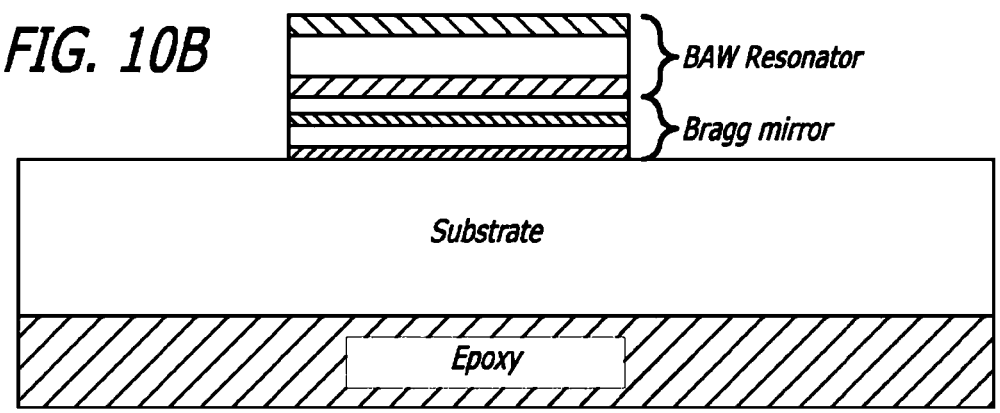

The following description is to provide a better understanding of the various aspects of the invention. The generic structure of a BAW resonator on a Bragg mirror on a substrate is shown in FIG. 10A. In this case the substrate backside may be polished or rough and the substrate backing is arbitrary. One aspect of the invention is that to reduce phase and amplitude ripples in the BAW resonator frequency response, the substrate backside should be polished and coated with a material that has an acoustic impedance in the range of 0.01× to 1× that of the Bragg mirror high impedance layer (i.e., 101×10$^6$ kg/m$^2$s for tungsten) and is also a good absorber of acoustic energy (i.e., epoxy), as shown in FIG. 10B.

To understand the operation of this invention, consider the basic BAW resonator shown in FIG. 11. The BAW resonator is composed of the AlN piezoelectric layer sandwiched between two electrodes as shown. In general the BAW resonator is designed to have a low acoustic impedance load (i.e., <<1000 kg/m$^2$s) presented to each electrode to provide a high reflection coefficient R at each electrode. This will reflect acoustic energy back into the piezoelectric AlN layer for proper operation. For a typical BAW resonator, with a piezoelectric layer that is nominally one-half wavelength thick at the operating frequency, the reflection coefficients are both near negative unity (i.e., R≈−1). For simplicity, the contribution of the electrode mechanical impedance is ignored in this analysis. The mismatch between the relatively high acoustic impedance AlN (34×106 kg/m$^2$s) and air (<1000 kg/m$^2$s) results in R≈−1 as shown. When air is on each side of the AlN (ignoring the contribution of the top and bottom electrodes), then R≈−1 (i.e., −100%) which satisfies this condition.

In a practical BAW resonator this requirement for $R \approx -1$ is easily accomplished for the top electrode by having air as the load impedance, but requires a Bragg mirror (See FIG. 12) to achieve this condition for the bottom electrode in an SMR (solidly mounted resonator) BAW by generating the virtual low impedance $Z_n$. To accomplish this, the acoustic load impedance $Z_{load}$ should be lower than the acoustic impedance of the high acoustic impedance Bragg mirror layers (i.e., tungsten, W, with an acoustic impedance of $101 \times 10^6$ kg/m²s).

To understand the operation of the Bragg mirror, start with the transmission line impedance equation that computes the input impedance $Z_i$ for a section of transmission line of phase shift $\theta_i$, with characteristic impedance $Z_i$ and terminating impedance $Z_{i-1}$:

$$Z_i = Z_i \left[ \frac{Z_{i-1} \cos\theta_i + jZ_i \sin\theta_i}{Z_i \cos\theta_i + jZ_{i-1} \sin\theta_i} \right]$$

Where:
i=1 ... n, where i=1 is the layer next to the substrate and i=n is the layer nest to the piezo (AlN) layer
$Z_i$ is the acoustic impedance of the considered layer i
$Z_{i-1}$ is the acoustic impedance of the previously considered layer $\theta_i$ is the phase shift across layer i $$\theta_i = \frac{\omega x d_i}{v_i}$$

Where:
$v_i$ is the velocity of the acoustic wave in layer i
$d_i$ is the thickness of layer i
$\omega$ is the radian frequency The reflection coefficient R at the top surface of the Bragg mirror is computed using the standard equation:

$$R = \frac{Z_n - Z_p}{Z_n + Z_p}$$

Where:
$Z_p$ is the acoustic impedance of the piezoelectric (AlN) material.
$Z_n$ is the acoustic impedance at the top surface of layer n, which is adjacent to the bottom of the piezoelectric (AlN) layer. For simplicity, the electrodes may be ignored, so assume that the bottom of the AlN piezoelectric layer is in contact with the top of the Bragg mirror.

The above equations are used to compute the reflection coefficient R at the top of the Bragg mirror for the longitudinal wave mode using the acoustic impedances and velocities listed in Table 1.

TABLE 1

| Material | Longitudinal wave acoustic velocity v (m/s) | Longitudinal wave acoustic impedance ($10^6$ kg/m²s) |
|---|---|---|
| Al | 6422 | 17.3 |
| W | 5230 | 101 |
| AlN | 10400 | 34 |
| SiO2 | 5970 | 13.1 |
| Si | 8847 | 19.3 |
| SiN | 11150 | 36.2 |
| Mo | 6660 | 48.6 |

TABLE 1-continued

| Material | Longitudinal wave acoustic velocity v (m/s) | Longitudinal wave acoustic impedance ($10^6$ kg/m²s) |
|---|---|---|
| Epoxy | 2200 | 2.4 |
| Air | N/A | 0.00043 |

Acoustic Impedance and Velocity for Longitudinal Wave Mode.

To meet the requirement that the substrate have a lower acoustic impedance than the Bragg mirror high acoustic impedance layer (W in this case), it is typically assumed that the substrate is silicon and infinitely thick. At frequencies where the low and high impedance layers in the Bragg mirror are a quarter wavelength thick ($\lambda_L/4$) for the longitudinal mode, as shown in FIG. 12, this condition will create a very low input acoustic impedance, $Z_n$, and consequently a reflection coefficient R that approaches negative unity. For example, an infinitely thick silicon substrate will present an acoustic load impedance of $Z_{load}=19.3 \times 10^6$ kg/m²s, and the four layer Bragg mirror will generate an input impedance of $Z_n=0.00546 \times 10^6$ kg/m²s. Ignoring the bottom electrode gives a reflection coefficient R at the AlN piezoelectric interface of R=−0.9997 (−9.997%).

For a finite thickness substrate (with acoustic impedance $Z_{sub}$) there are frequencies where the substrate thickness T is equal to odd multiples of a longitudinal mode quarter wavelength. When this happens the acoustic impedance of the substrate backside $Z_{backside}$ will be transformed into an acoustic load impedance $Z_{load}$ at the bottom of the Bragg mirror given by:

$$Z_{load} = Z_{sub}^2 / Z_{backside}$$

Figure 13:
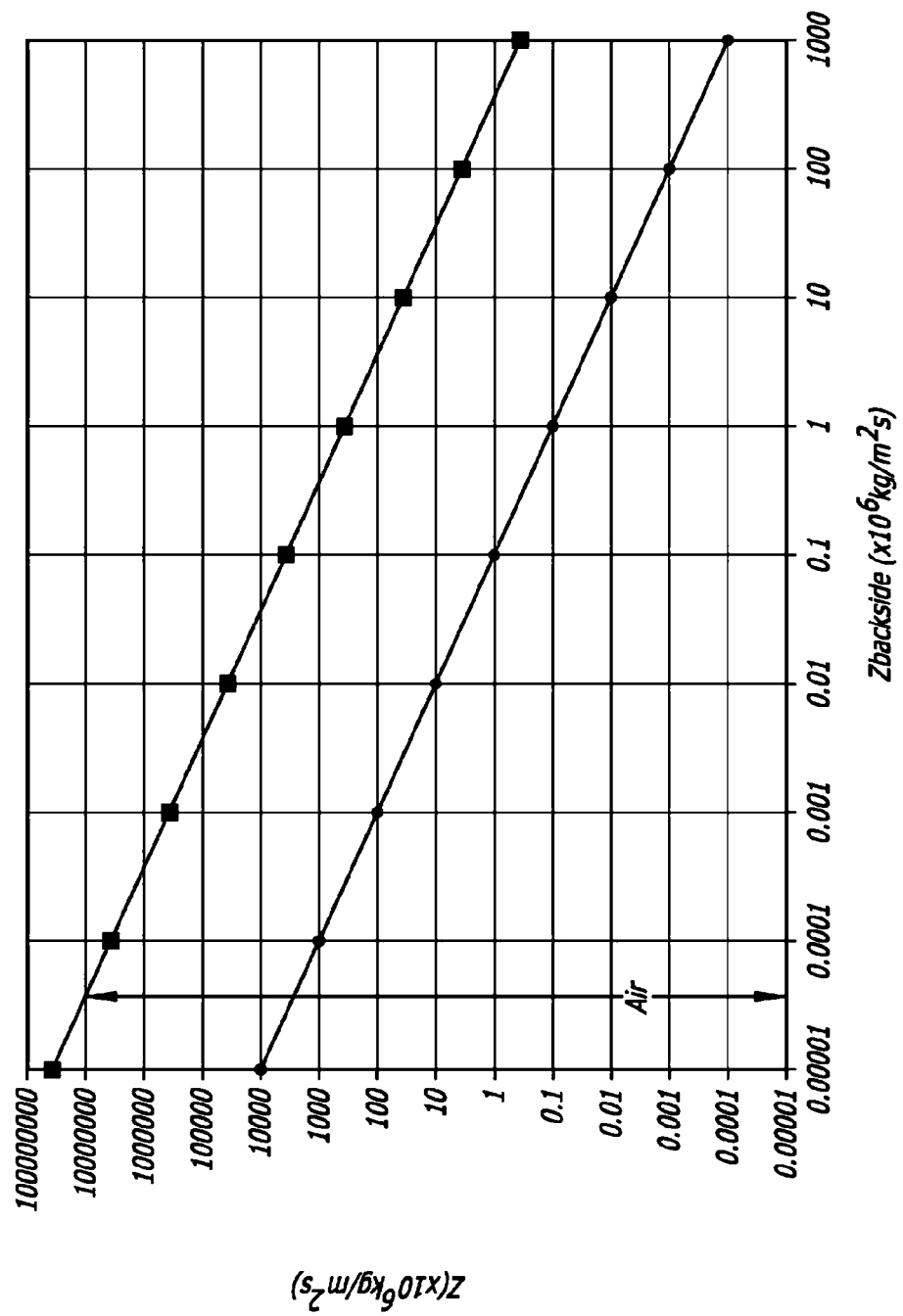
FIG. 13 shows how the acoustic load impedance $Z_{load}$ and input impedance $Z_n$ vary with acoustic backside impedance $Z_{backside}$ for a silicon substrate ($Z_{sub}=19.3\times10^6$ kg/m$^2$s) that is an odd number of quarter wavelengths thick (T=(2n+1)$\lambda_L$/4, n=0, 1, 2 . . . ).
Figure 14:
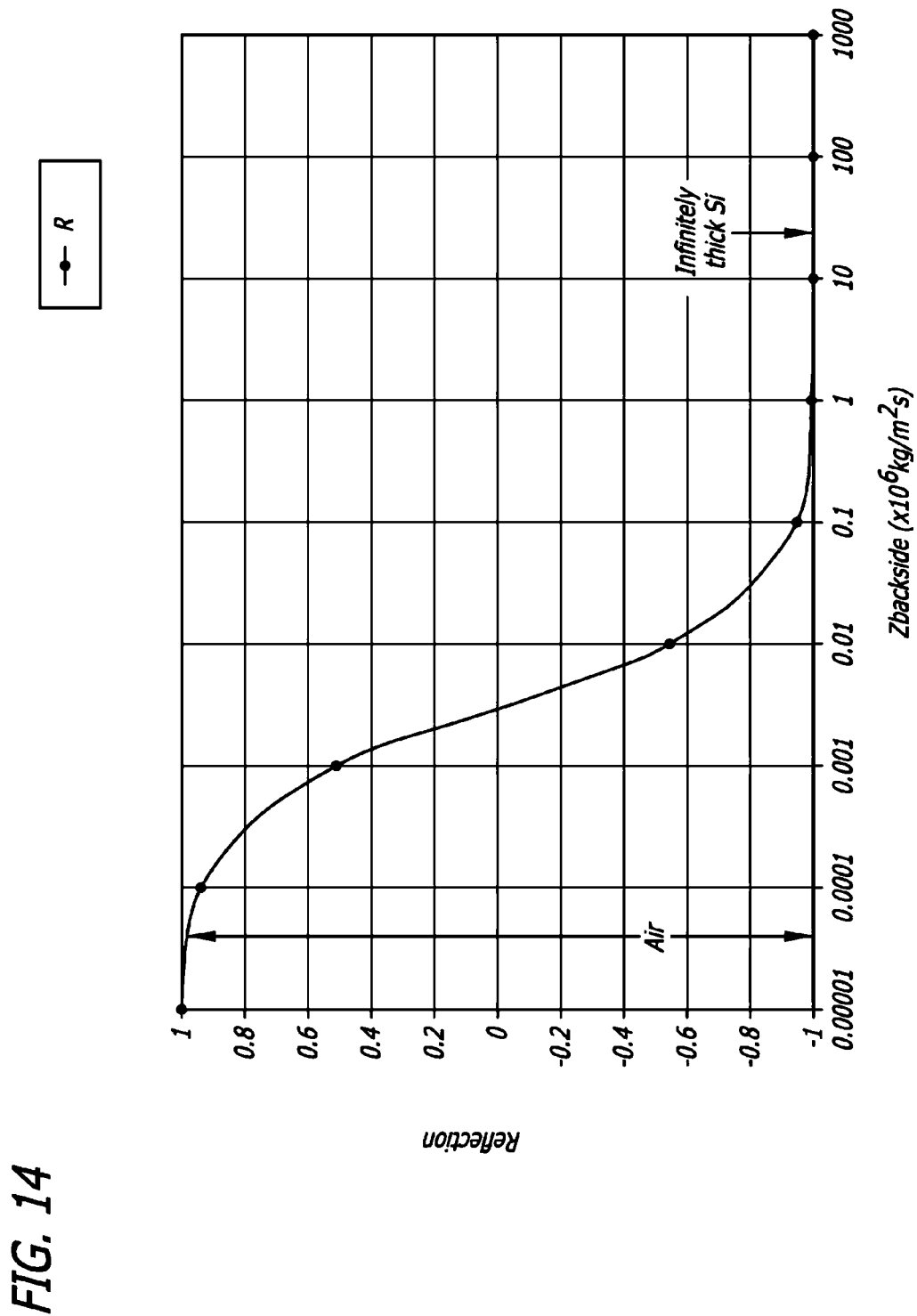
FIG. 14 shows reflection coefficient R at the interface between the BAW resonator in FIG. 11 and the four layer Bragg mirror in FIG. 12 versus backside acoustic impedance when the silicon substrate thickness T is T=(2n+1)$\lambda_L$/4.

FIG. 13 shows how the acoustic load impedance $Z_{load}$ and input impedance $Z_n$ vary with acoustic backside impedance $Z_{backside}$ for a silicon substrate ($Z_{sub}=19.3 \times 10^6$ kg/m²s) that is an odd number of quarter wavelengths thick (T=(2n+1)$\lambda_L/4$, n=0, 1, 2 ... ). For example, if the substrate backside is air ($Z_{backside}=430$ kg/m²s) then $Z_{load} \approx 9 \times 10^{12}$ then the Bragg mirror (when it is operating at its design frequency where each layer is at or near $\lambda_L/4$ thick) will transform $Z_{load}$ into $Z_n=2635 \times 10^6$ kg/m²s and R=0.975 (97.5%), as shown in FIG. 14. This does not satisfy two necessary conditions for proper operation of the BAW resonator:
 1. The bottom electrode reflection coefficient (R=0.975) is not of the same sign as the top electrode reflection coefficient (R≈−1). This does not satisfy the necessary boundary condition for proper operation of the BAW resonator.
 2. The reflection coefficient is not large enough in magnitude (i.e., >0.99) to prevent leakage from the resonator into the Bragg mirror.

This condition will cause ripples in the BAW resonator response, and they will occur at frequencies where the substrate thickness T is an odd multiple of a quarter wavelength, as given by:

$$freq = (2n+1)\left(\frac{v_{sub}}{4T}\right), n = 0, 1, 2, 3 \ldots$$

Figure 1:
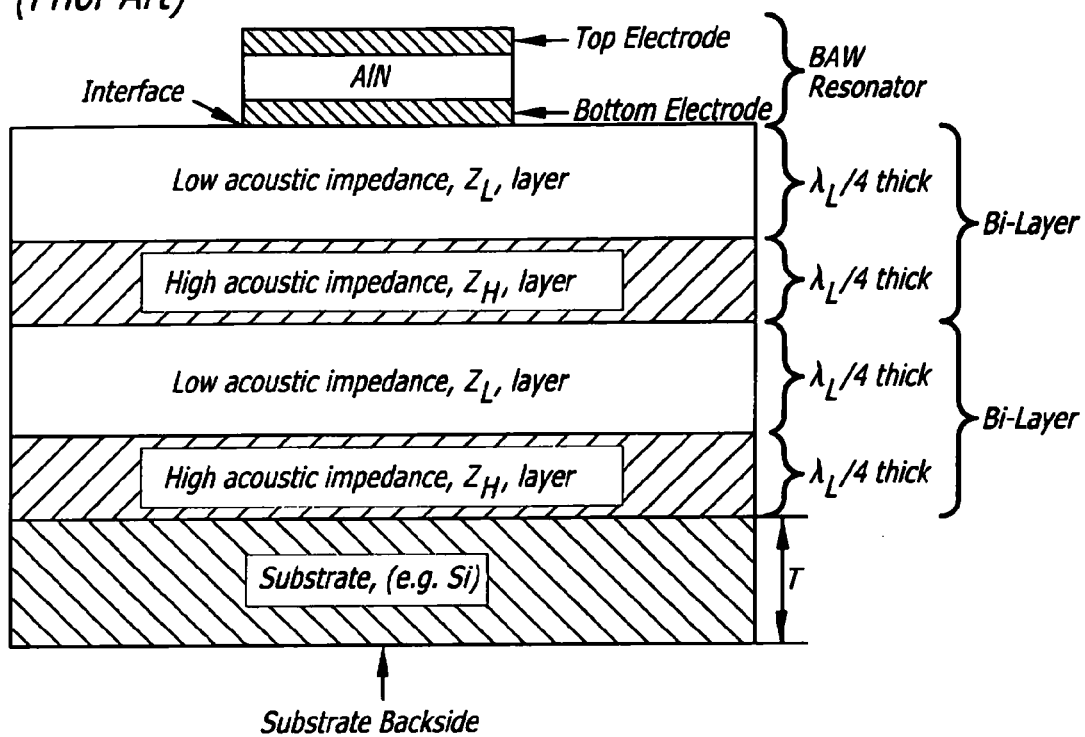
FIG. 1 is a schematic drawing of a solidly mounted resonator on a Bragg mirror stack of two bi-layers.
Figure 2:
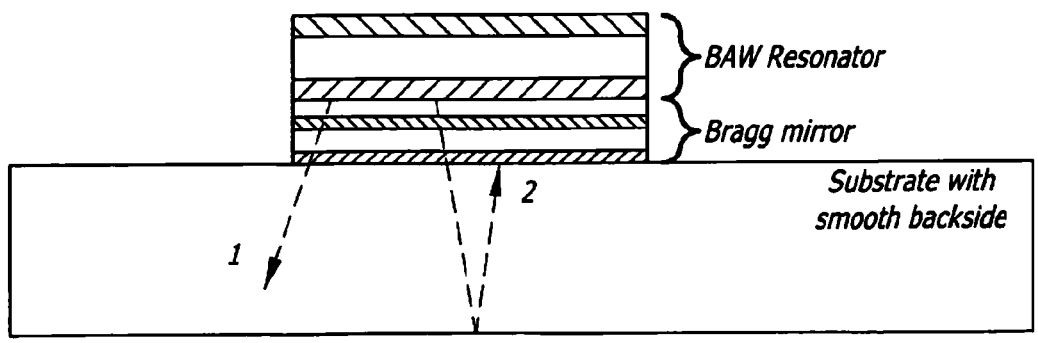
FIG. 2 illustrates the leakage of acoustic energy through the Bragg mirror.
Figure 3:
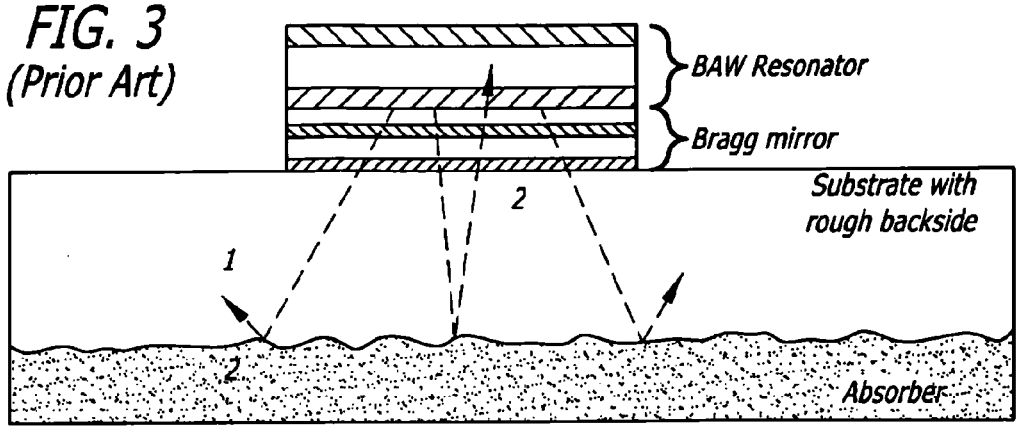
FIG. 3 schematically illustrates a substrate with a rough backside and absorber on the backside.

For example, for silicon $v_{sub}=8847$ (m/s) and T=725 μm, then freq=(2n+1)3.05 MHz, which means that the ripples will occur every 6.1 MHz as shown in FIG. 5. The acoustic losses in the silicon substrate and the multiple reflection paths from the substrate backside to the bottom of the Bragg mirror (see FIG. 2) smooth out the ripples, which would be much more pronounced in an ideal one dimensional model.

FIG. 14 provides the reflection coefficient R at the interface between the BAW resonator in FIG. 11 and the four layer Bragg mirror in FIG. 12 versus backside acoustic impedance when the silicon substrate thickness T is $T=(2n+1)\lambda_L/4$. For proper resonator operation the ideal boundary condition at the interface is $R=-1$. FIG. 14 shows that $Z_{backside}$ must be greater than about $1\times10^6$ kg/m²s to achieve a high reflection coefficient of negative polarity (i.e., $R=-0/994$ for this value). This impedance can be achieved with a variety of epoxy type materials (Table 1 shows that a typical value for an epoxy is $2.4\times10^6$ kg/m²s, which gives $R=99.7\%$) that will adhere to a polished substrate backside. To avoid problems associated with reflections at the epoxy backside itself, this material should have high acoustic attenuation. Most epoxies are lossy to acoustic energy (i.e., 35 dB/mm at 5 MHz), so a 0.25 mm (~0.01") thick layer of epoxy will have about ~10 dB attenuation as the signal propagates each way, for a total of ~20 dB return loss. This has been demonstrated to perform well as shown by the data in FIGS. 7 to 9. The upper bound on the backside impedance is approximately that of this high impedance Bragg mirror layer (i.e., $101\times10^6$ kg/m²s for W in this example), otherwise a similar problem will occur when the substrate thickness T is integer multiples of a half-wavelength.

In summary, the acoustic impedance of the material applied to the polished backside should be on the order of 0.01× to 1.0× that of the acoustic impedance of the high impedance Bragg mirror layer. In this example where Tungsten is the high impedance layer, the acoustic impedance of the material applied to the polished substrate backside should range from $1\text{-}100\times10^6$ kg/m²s. In the data shown, the impedance of the epoxy used was approximately $2.4\times10^6$ kg/m²s, which satisfies this condition.

The invention solves the inherent problem of passband ripple in BAW resonators and BAW filters caused by longitudinal modes resonating in the finite thickness BAW resonator substrate. The consequence of this achievement is improved passband linearity, reduced phase dispersion, and adherence to passband insertion loss (I.L.) specifications through elimination of dips in passband.

Thus while certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A BAW resonator with reduced phase and amplitude ripples in a frequency response, the BAW resonator comprising:
    a substrate having a first side, a second side opposite the first side, and a thickness of 400 μm or less, the second side of the substrate being a polished surface with a peak-to-peak roughness of approximately 1000 A;
    a Bragg mirror having alternate layers of a high acoustic impedance material and a low acoustic impedance material fabricated on the first side of the substrate;
    a BAW resonator fabricated on the Bragg mirror; and
    a lossy material coating the second side of the substrate, the lossy material having an acoustic impedance in the range of 0.01× to 1.0× the acoustic impedance of the layers of high acoustic impedance material.

2. The BAW resonator of claim 1 wherein the lossy material is epoxy.

3. The BAW resonator of claim 1 wherein the substrate is approximately 325 μm thick.

4. The BAW resonator of claim 1 wherein the layers of high acoustic impedance material are tungsten.

5. A BAW resonator with reduced phase and amplitude ripples in a frequency response, the BAW resonator comprising:
    a substrate having a first side, a second side opposite the first side, and a thickness of 400 μm or less, the second side of the substrate being a polished surface with a peak-to-peak roughness of approximately 1000 A;
    a Bragg mirror having alternate layers of tungsten and a low acoustic impedance material fabricated on the first side of the substrate;
    a BAW resonator fabricated on the Bragg mirror;
    a lossy epoxy material coating the second side of the substrate, the lossy epoxy material having an acoustic impedance in the range of 0.01× to 1.0× the acoustic impedance of the layers of tungsten.

6. The BAW resonator of claim 5 wherein the substrate is approximately 325 μm thick.

* * * * *